United States Patent [19]
Eidelloth, deceased et al.

[11] Patent Number: 5,332,723
[45] Date of Patent: Jul. 26, 1994

[54] SUPERCONDUCTING THIN FILM WITH FULLERENES AND METHOD OF MAKING

[75] Inventors: Walter Eidelloth, deceased, late of Yorktown, N.Y.; James T. Busch, heir, Arlington, Va.; Richard J. Gambino, Yorktown Heights, N.Y.; Rodney Ruoff, Menlo Park, Calif.; Claudia D. Tesche, Helsinki, Finland

[73] Assignee: The United States of America as represented by the Secretary of the Navy, Washington, D.C.

[21] Appl. No.: 98,094

[22] Filed: Jul. 28, 1993

[51] Int. Cl.$^5$ .............................. H01L 39/12
[52] U.S. Cl. ...................... 505/125; 252/518; 505/785; 505/410; 505/412; 505/460
[58] Field of Search ............ 252/518, 521; 505/1, 505/785, 725

[56] References Cited

U.S. PATENT DOCUMENTS

| | | | |
|---|---|---|---|
| 4,996,192 | 2/1991 | Fleischer | 505/785 |
| 5,084,436 | 1/1992 | Morimoto | 505/785 |
| 5,240,903 | 8/1993 | Shimoyama | 505/785 |

OTHER PUBLICATIONS

T. T. M. Palstra, et al; "Angular Dependence of the Upper Critical Field of $Bi_{2.2}Sr_2Ca_{0.8}Cu_2O_{8+}$"; *Physical Review*; pp. 5101–5105, Sep. 1988.

R. B. van Dover, et al.; "Critical Currents Near $10^6$ A cm$^{-2}$ At 77K in Neutron-Irradiated Single=Crystal $YBa_2Cu_3O_7$"; *Nature*, Nov. 2, 1989; pp. 55–57.

L. Civale, et al.; "Defect Independence of the Irreversibility Line in Proton-Irradiated Y-Ba-Cu-O Crystals"; Aug. 27, 1990; *Physical Review Letters*; pp. 1164–1167.

T. K. Worthington, et al.; "Anisotropic Nature of High--Temperature Superconductivity in Single-Crystal $Y_2Ba_2Cu_3O_{7-x}$"; *The American Physical Society*; pp. 1160–1163; Sep. 1987.

Primary Examiner—Paul Lieberman
Assistant Examiner—John Boyd
Attorney, Agent, or Firm—William F. McCarthy; Thomas E. McDonald; James T. Busch

[57] ABSTRACT

A method of producing a new high Tc superconducting material using fullerene molecules as artificial pinning sites for any magnetic flux that may enter the material.

3 Claims, 2 Drawing Sheets

SUPERCONDUCTING THIN FILM WITH FULLERENES AND METHOD OF MAKING

BACKGROUND OF THE INVENTION

For most applications of superconductors the critical current density is the true figure of merit—the higher the better. In type II superconductors such as the high-$T_c$ materials, magnetic flux can easily enter the body of the material, i.e., the lower critical field $H_{c1}$ is very small. It is important to "pin" such magnetic flux because motion of flux lines implies dissipation. Such pinning action occurs naturally at any sort of defect in the material. There are various techniques to improve the critical current density by introducing artificial defects; irradiation of thin films with neutrons as described by Van Dover et al., Nature, 55, 1989, and with protons as described by T. K. Worthington et al., Phys. Rev. Lett. 65, pg. 1164, 1990 have been reported. The creation of more pinning sites is reasonable as long as the critical current density is limited by flux depinning.

Other methods of artificially increasing the defect density have also been tried including ion irradiation and cation substitution.

SUMMARY OF THE INVENTION

Our invention uses a new technique to create artificial pinning sites in high-$T_c$ thin films during the film growth with the help of the recently discovered C-60 molecules. These molecules can be deposited simultaneously as the thin film is grown. Their chemical potential will prevent a direct reaction of atomic carbon with the high-$T_c$ thin film which would be detrimental to the superconducting properties of the film. However, the C-60 molecules will act as localized defects and they will form excellent pinning sites. Disruption of the superconducting wavefunction can at best occur on a length scale comparable to the coherence length.

Therefore it is imperative to create defects of this size. The diameter of the C-60 molecules coincides very well with measured values of the coherence lengths in high-$T_c$ materials. In this regard see T.K. Worthington et al., Phys. Rev. Lett. 59, pg. 1160, 1987 and T.T.M. Palstia et al., Phys. Rev. B38, pg. 5102, 1988. As other carbon cage "fullerene" molecules exist, it is implied that they could also be employed. A steady gradation of carbon cage diameters is therefore available, and this allows some control of the nature of the pinning site.

One object of our invention is to create a new superconducting material which has a high critical current density.

Another object of our invention is to provide the steps necessary to make a high critical current density superconducting material.

A further object of our invention is to utilize the newly discovered fullerene molecules, i.e., $C_{60}$, $C_{70}$ etc., as artificial pinning sites in a superconducting material so that magnetic flux lines are relatively motionless.

DESCRIPTION OF THE PREFERRED EMBODIMENTS

Figure 1:
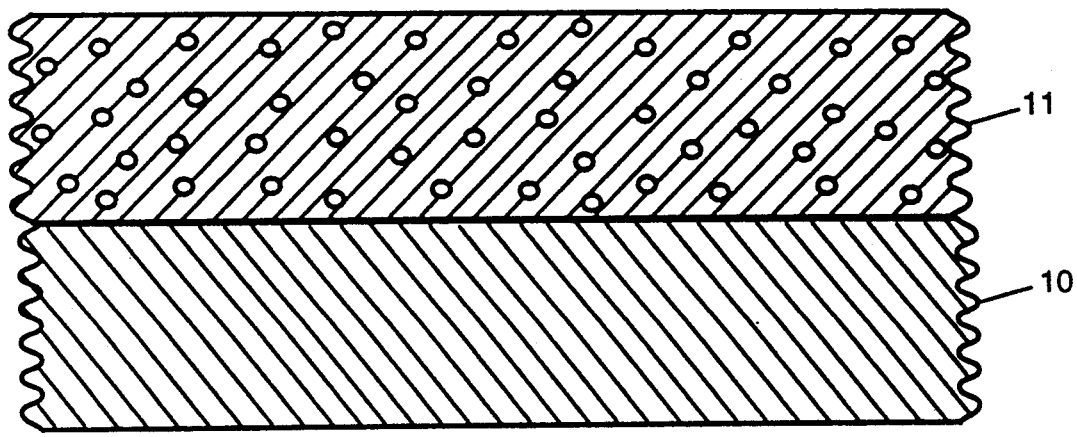
FIG. 1(a) depicts a cuprate superconductor matrix with fullerene molecules therein which is on a single crystal substrate.
FIG. 1(b) shows an improved thin film superconductor in which the mixed cuprate and fullerenes are deposited in alternate layers and are aligned crystallographically with the single al substrate.
Figure 1:
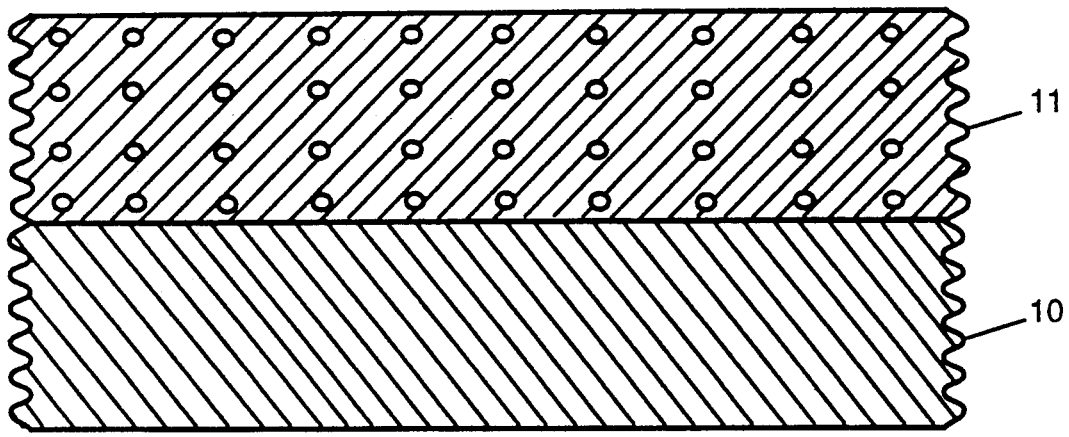
Figure 2:
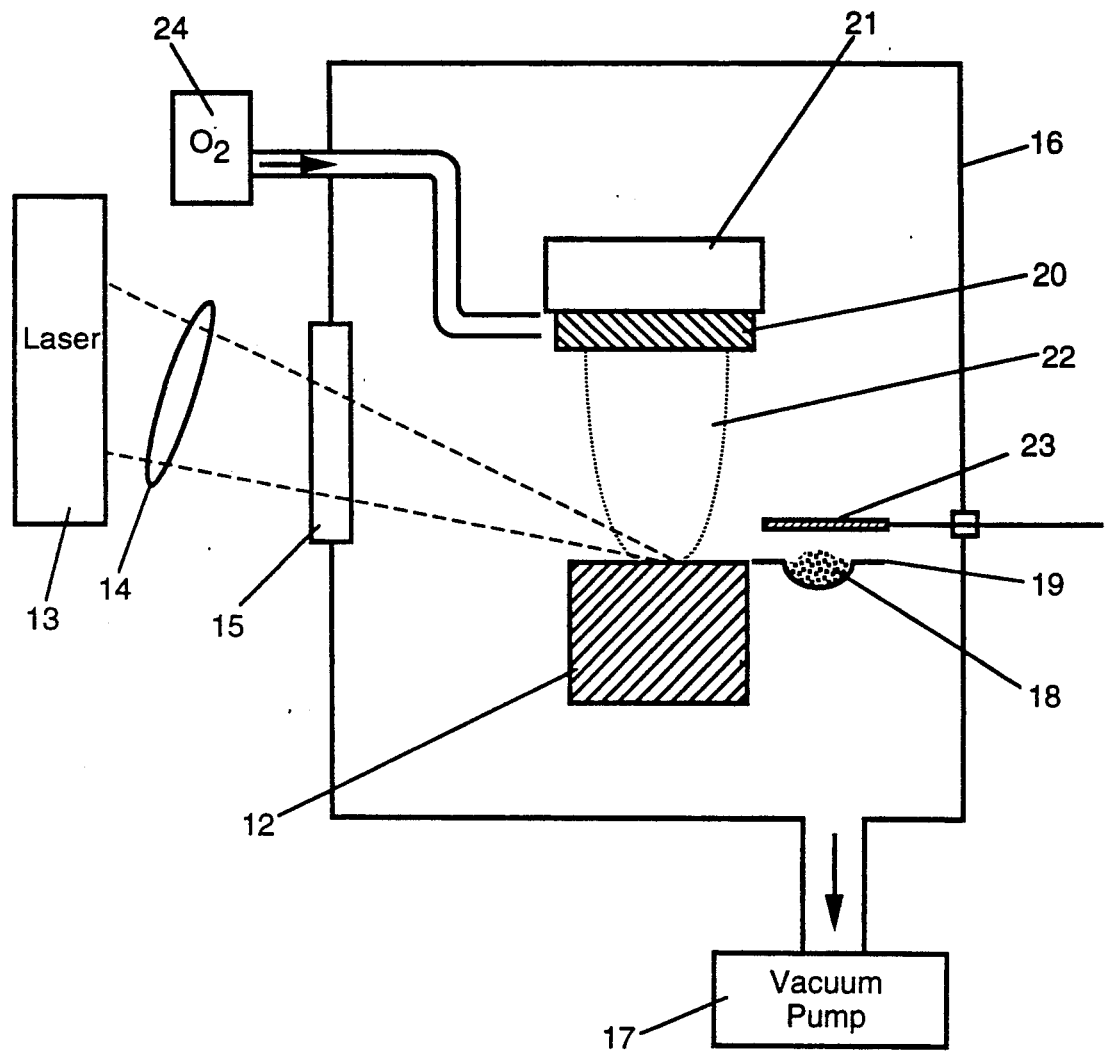
FIG. 2 is a side view of the apparatus used to make the improved thin film superconductor.

Referring now to the FIGS. 1 and 2 wherein like numbers refer to the same elements.

FIG. 1(a) shows a superconductor cuprate matrix 11 which is mixed with fullerene molecules and is atop a substrate This is the superconductor which results from the method described now with relation to FIG. 2. There is shown a pulsed laser 13 preferably of the excimer type which operates at a wavelength of about 248 nanometers. The laser beam is focused through lens 14 and beamed through a window 15 of quartz glass into vacuum chamber 16. Any suitable vacuum pump 17 can be used to evacuate the chamber 16. The cuprate target 12 is placed in the vacuum chamber 16 with a partial pressure of about 200 mTorr $O_2$ supplied from an oxygen source 24. As the laser beam strikes the target source 12 a plume of cuprate 22 is deposited on the substrate 20. Placed near the target 12 is a fullerene, such as $C_{60}$, powder 18 in a tungsten boat 19. $C_{60}$ sublimes in a vacuum at about 350° C. so by heating the boat 19 to a temperature of about 350° C. a source of $C_{60}$ molecules are delivered to the substrate 20 surface at a controllable rate by moving the shutter 23 as desired. The tungsten boat is generally heated by suppling an electrical current through the boat from any convenient source which has not been shown in FIG. 2 for the sake of clarity $C_{60}$ is known to be stable in a gas phase at 800° C. and is likely stable at ever higher temperatures. The substrate 20 is a single crystal material which in our preferred embodiment is strontium titanate ($SrTiO_3$). Other single crystal materials such as lanthanum gallate ($LaGaO_3$) or magnesium oxide (MgO) could also be used. The substrate 20 is heated by any conventional heater 21 to a temperature of about 750° C.

In our preferred embodiment evaporation from the cuprate target source 12 and the fullerene source 18 occurs simultaneously so that the vapor from both sources is deposited on the substrate 20 to form a solid. The C-60 can also be delivered in a controllable way so as to produce novel layered structures. Such alternate flux pinned/flux not pinned multilayer structures could have novel properties.

It is claimed:

1. An improved high temperature superconductor comprising a matrix of a cuprate high temperature superconductor in which is dispersed isolated molecules of one or more of the fullerene compounds, where the volume fraction occupied by the fullerene molecules is at least in an amount sufficient to increase the critical current density of said cuprate high temperature superconductor less than 25%.

2. The superconductor of claim 1 in which said matrix is a thin film upon a single crystal substrate.

3. The material of claim 2 which is in the form of an epitaxial thin film with the cuprate high temperature superconductor substantially aligned crystallographically with said single crystal substrate.

* * * * *